(12) United States Patent
Asao et al.

(10) Patent No.: US 7,767,469 B2
(45) Date of Patent: Aug. 3, 2010

(54) MAGNETIC RANDOM ACCESS MEMORY AND METHOD OF MANUFACTURING THE SAME

(75) Inventors: Yoshiaki Asao, Sagamihara (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 8 days.

(21) Appl. No.: 12/108,993

(22) Filed: Apr. 24, 2008

(65) Prior Publication Data

US 2008/0206895 A1 Aug. 28, 2008

Related U.S. Application Data

(62) Division of application No. 10/989,339, filed on Nov. 17, 2004, now Pat. No. 7,372,118.

(30) Foreign Application Priority Data

Sep. 14, 2004 (JP) .............................. 2004-266936

(51) Int. Cl.
*H01L 21/00* (2006.01)
*H01L 21/8222* (2006.01)
(52) U.S. Cl. .......................................... 438/2; 438/340
(58) Field of Classification Search ............... 438/3, 438/240, 340
See application file for complete search history.

(56) References Cited

U.S. PATENT DOCUMENTS

| 5,650,958 | A | 7/1997 | Gallagher et al. |
| 6,097,625 | A | 8/2000 | Scheuerlein |
| 6,226,160 | B1 | 5/2001 | Gallagher et al. |
| 6,754,053 | B2 | 6/2004 | Yoshikawa et al. |
| 6,797,536 | B2 | 9/2004 | Yoda et al. |
| 6,884,630 | B2* | 4/2005 | Gupta et al. .................... 438/3 |
| 6,960,815 | B2 | 11/2005 | Yoda et al. |
| 7,084,469 | B2 | 8/2006 | Fukuzumi |
| 7,122,854 | B2 | 10/2006 | Fukuzumi |
| 7,158,406 | B2 | 1/2007 | Iwata |
| 2002/0146851 | A1* | 10/2002 | Okazawa et al. ............... 438/3 |
| 2004/0063223 | A1 | 4/2004 | Costrini et al. |
| 2004/0150922 | A1* | 8/2004 | Kagami et al. ........... 360/324.2 |

FOREIGN PATENT DOCUMENTS

| JP | 2002-299726 | 10/2002 |
| JP | 2003-218431 | 7/2003 |
| JP | 2003-243630 | 8/2003 |
| JP | 2004-179250 | 6/2004 |

* cited by examiner

*Primary Examiner*—Howard Weiss
*Assistant Examiner*—Steven H Rao
(74) *Attorney, Agent, or Firm*—Oblon, Spivak, McClelland, Maier & Neustadt, L.L.P.

(57) ABSTRACT

A magnetic random access memory includes, a lower electrode, a magnetoresistive element which is arranged above the lower electrode and has side surfaces, and a protective film which covers the side surfaces of the magnetoresistive element, has a same planar shape as the lower electrode, and is formed by one of sputtering, plasma CVD, and ALD.

7 Claims, 13 Drawing Sheets

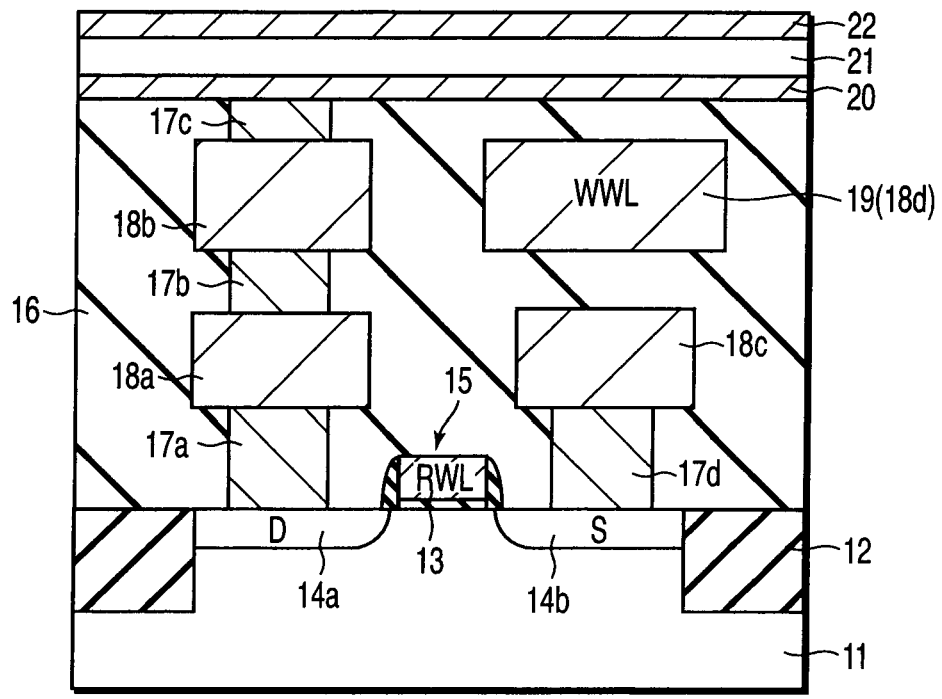
F I G. 3
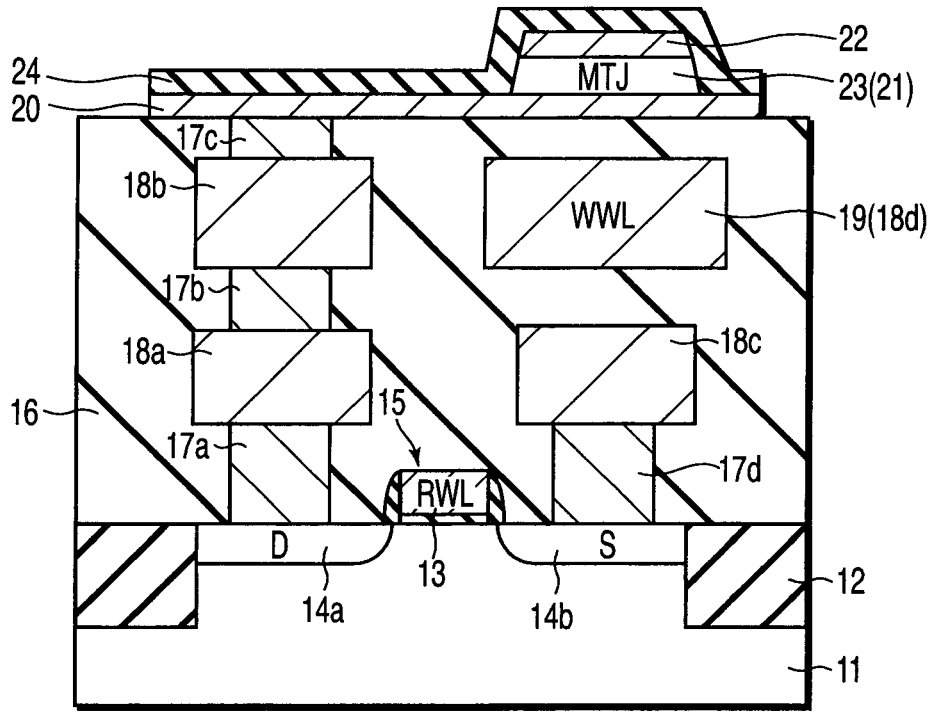
F I G. 4

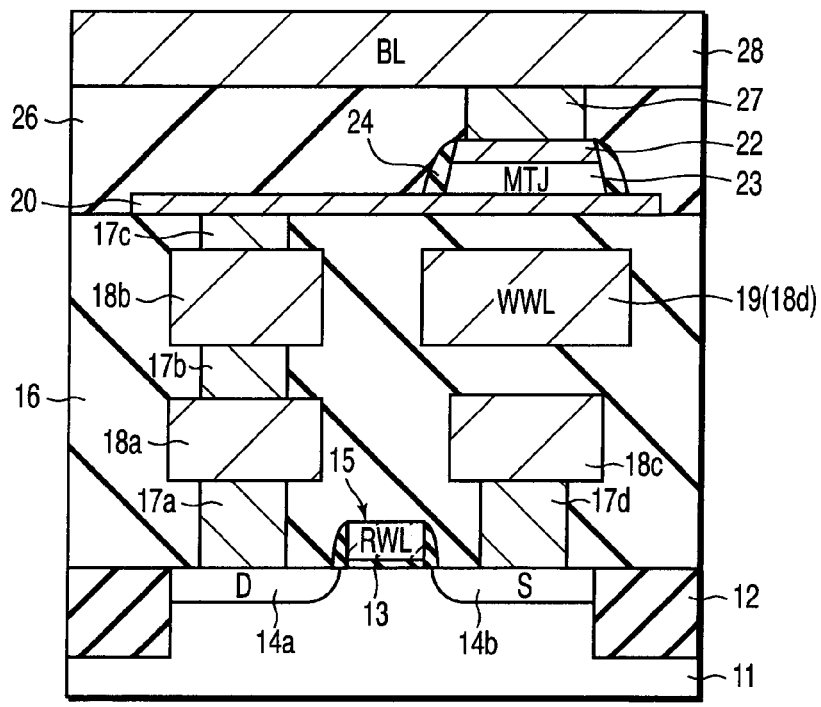
F I G. 5
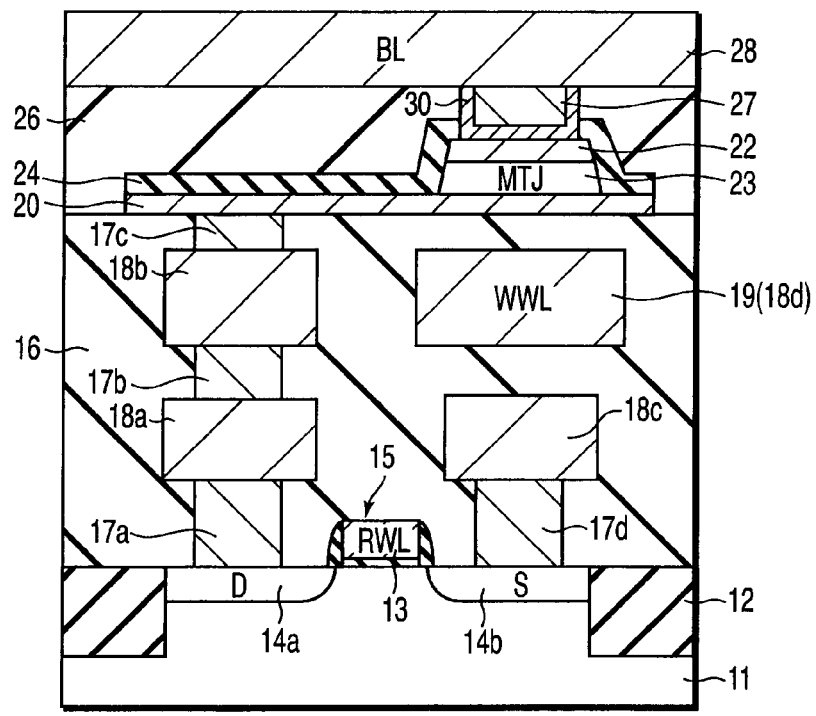
F I G. 6

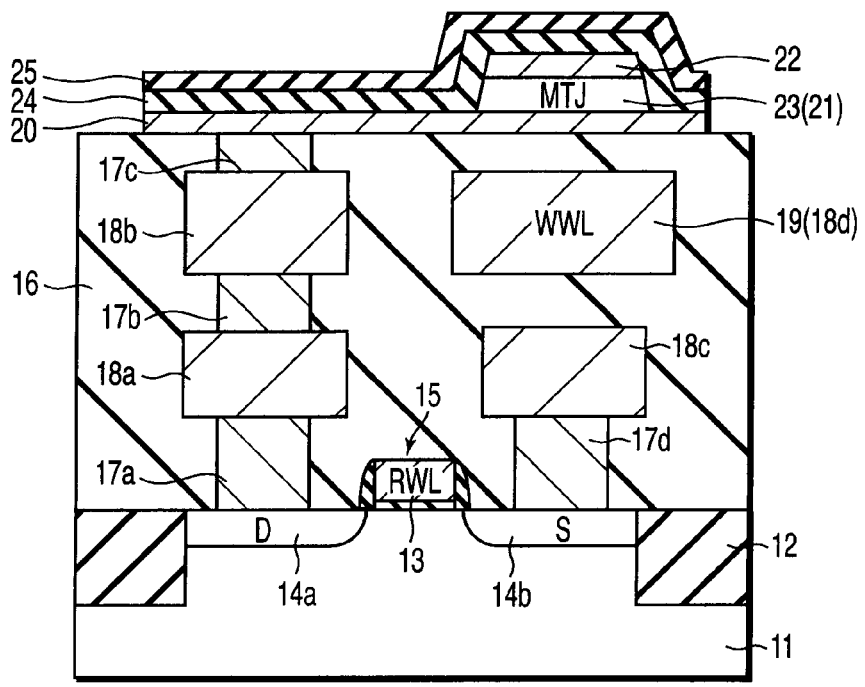
F I G. 9
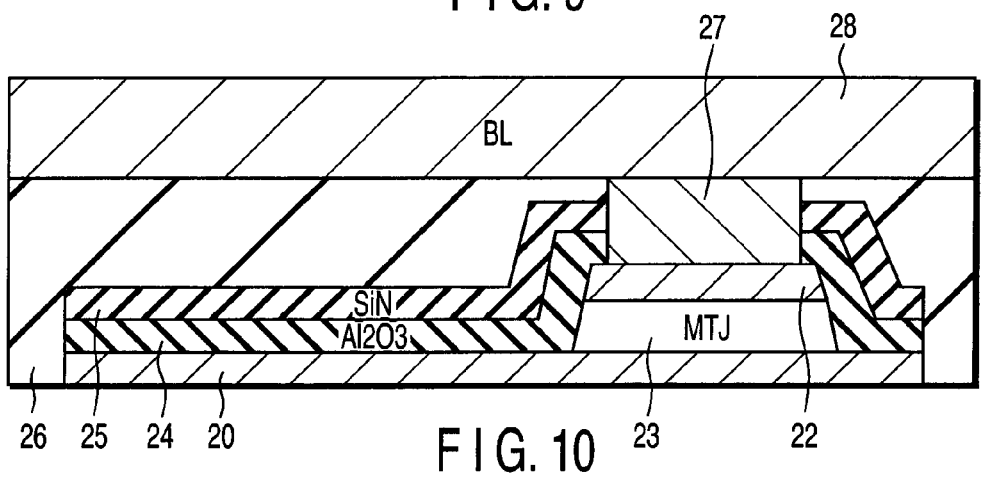
F I G. 10
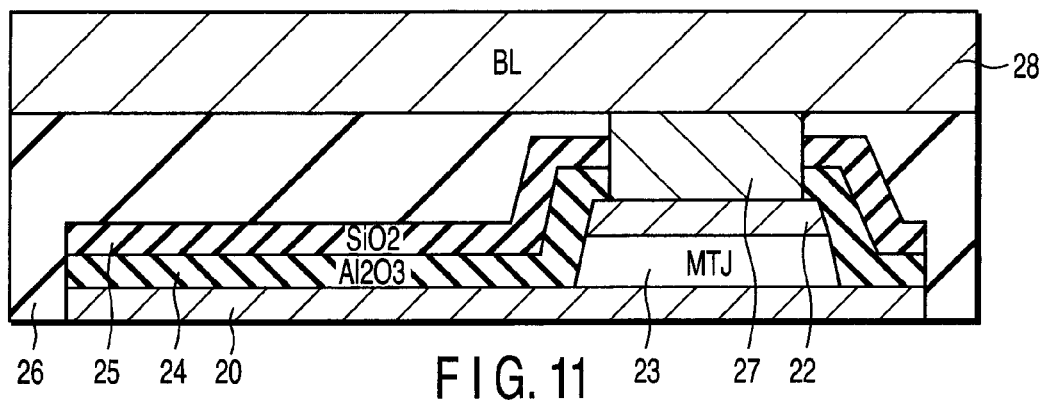
F I G. 11

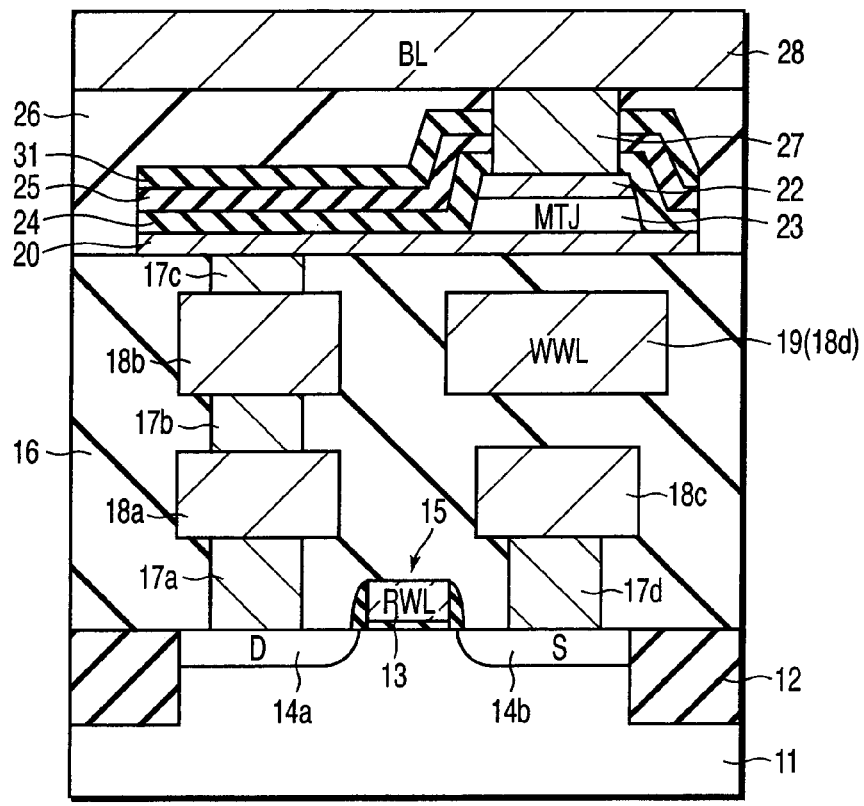
F I G. 18
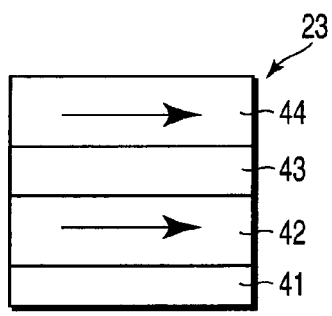
F I G. 19A
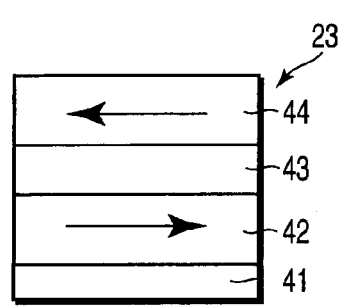
F I G. 19B
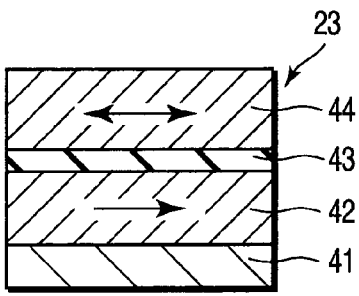
F I G. 20A
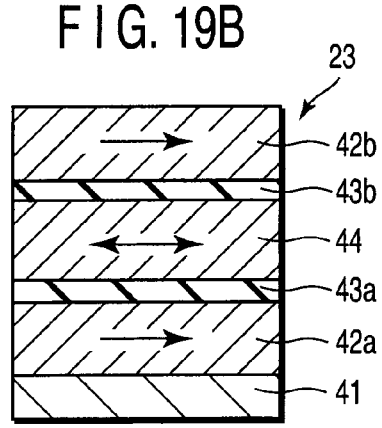
F I G. 20B

MAGNETIC RANDOM ACCESS MEMORY AND METHOD OF MANUFACTURING THE SAME

CROSS-REFERENCE TO RELATED APPLICATIONS

This application is a Division of and claims the benefit of priority under 35 USC §120 from U.S. Ser. No. 10/989,339, filed Nov. 17, 2004 and claims the benefit of priority from prior Japanese Patent Application No. 2004-266936, filed Sep. 14, 2004, the entire contents of which are incorporated herein by reference.

BACKGROUND OF THE INVENTION

1. Field of the Invention

The present invention relates to an MRAM (Magnetic Random Access Memory) which forms a memory cell by using an MTJ (Magnetic Tunnel Junction) element which stores "1" or "0" data by the TMR (Tunneling MagnetoResistive) effect, and a method of manufacturing the same.

2. Description of the Related Art

A number of memories which store information by new principles have been proposed in recent years. One of them is a magnetic random access memory using the tunneling magnetoresistive effect.

The magnetic random access memory stores "1" or "0" data by using an MTJ (Magnetic Tunnel Junction) element. This MTJ element includes a fixed layer with fixed magnetization, a recording layer whose magnetization is inverted, and a tunnel insulating film sandwiched between the fixed layer and the recording layer. The "1" or "0" data stored in the MTJ element is determined on the basis of whether the magnetization directions of the fixed layer and recording layer are parallel or anti-parallel.

In the conventional magnetic random access memory, however, the characteristics of the magnetic material in the junction isolation sidewall and the tunnel insulating film of the MTJ element degrade due to outgas (e.g., $H_2O$) from the interlayer film buried around the MTJ element. For this reason, the magnetic characteristics of the MTJ element degrade.

Prior art related to the present invention is as follows:

[Patent Reference 1] Jpn. Pat. Appln. KOKAI Publication No. 2003-243630

[Patent Reference 2] Jpn. Pat. Appln. KOKAI Publication No. 2003-299726

BRIEF SUMMARY OF THE INVENTION

According to a first aspect of the present invention, there is provided a magnetic random access memory comprising a lower electrode, a magnetoresistive element which is arranged above the lower electrode and has side surfaces, and a protective film which covers the side surfaces of the magnetoresistive element, has a same planar shape as the lower electrode, and is formed by one of sputtering, plasma CVD, and ALD.

According to a second aspect of the present invention, there is provided a magnetic random access memory comprising a magnetoresistive element which has side surfaces, a first protective film which covers the side surfaces of the magnetoresistive element and is formed by one of sputtering, plasma CVD, and ALD, and a second protective film which is formed on the first protective film and essentially formed of a material different from a material of the first protective film.

According to a third aspect of the present invention, there is provided a method of manufacturing a magnetic random access memory, comprising forming a material layer to be processed into a magnetoresistive element, processing at least part of the material layer in a process apparatus to form the magnetoresistive element, and forming a first protective film which covers side surfaces of the magnetoresistive element in a consistently vacuum state in the process apparatus.

BRIEF DESCRIPTION OF THE SEVERAL VIEWS OF THE DRAWING

FIG. 3 is a sectional view showing a step in manufacturing the magnetic random access memory according to the first embodiment of the present invention;

FIG. 4 is a sectional view showing a step in manufacturing the magnetic random access memory according to the first embodiment of the present invention following FIG. 3;

FIG. 5 is a sectional view showing a structure in which a protective film remains on only the side surfaces of the MTJ element and upper electrode in the magnetic random access memory according to the first embodiment of the present invention;

FIG. 6 is a sectional view showing a structure in which a barrier metal of a contact is formed in the magnetic random access memory according to the first embodiment of the present invention;

FIG. 9 is a sectional view showing a step in manufacturing the magnetic random access memory according to the second embodiment of the present invention following FIG. 8;

FIG. 10 is a partial sectional view showing sample 1 of the magnetic random access memory according to the second embodiment of the present invention;

FIG. 11 is a partial sectional view showing sample 2 of the magnetic random access memory according to the second embodiment of the present invention;

FIG. 18 is a sectional view showing the three-layered structure of the protective film in the magnetic random access memory according to the second embodiment of the present invention;

FIGS. 19A and 19B are sectional views showing a basic MTJ element according to the third embodiment of the present invention;

FIGS. 20A and 20B are sectional views showing the tunnel junction of the MTJ element according to the third embodiment of the present invention;

FIGS. 25A and 25B are views showing a select diode cell of the magnetic random access memory according to the fourth embodiment of the present invention, in which FIG. 25A is a circuit diagram showing the memory cell array, and FIG. 25B is a sectional view showing one cell;

FIGS. 26A and 26B are views showing a cross-point cell of the magnetic random access memory according to the fourth embodiment of the present invention, in which FIG. 26A is a circuit diagram showing the memory cell array, and FIG. 26B is a sectional view showing one cell.

DETAILED DESCRIPTION OF THE INVENTION

Figure 1:
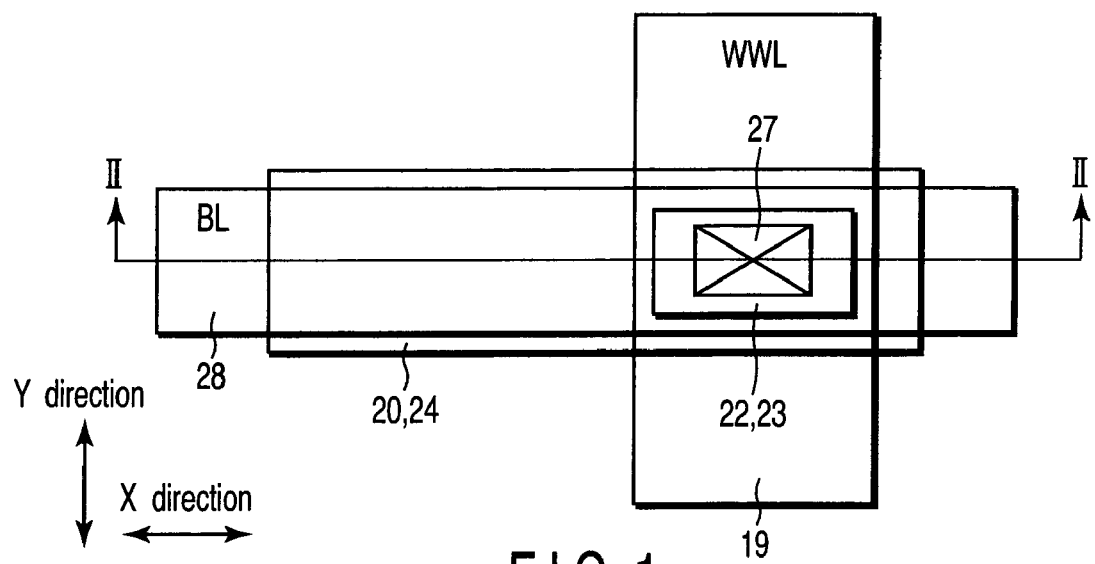
FIG. 1 is a schematic plan view showing a magnetic random access memory according to the first embodiment of the present invention.

The embodiments of the present invention will be described below with reference to the accompanying drawing. The same reference numerals denote the same part throughout the drawing.

First Embodiment

In the first embodiment, the protective film which protects an MTJ (Magnetic Tunnel Junction) element as a tunnel magnetoresistive element from outgas from the interlayer film has a single-layered structure.

Figure 2:
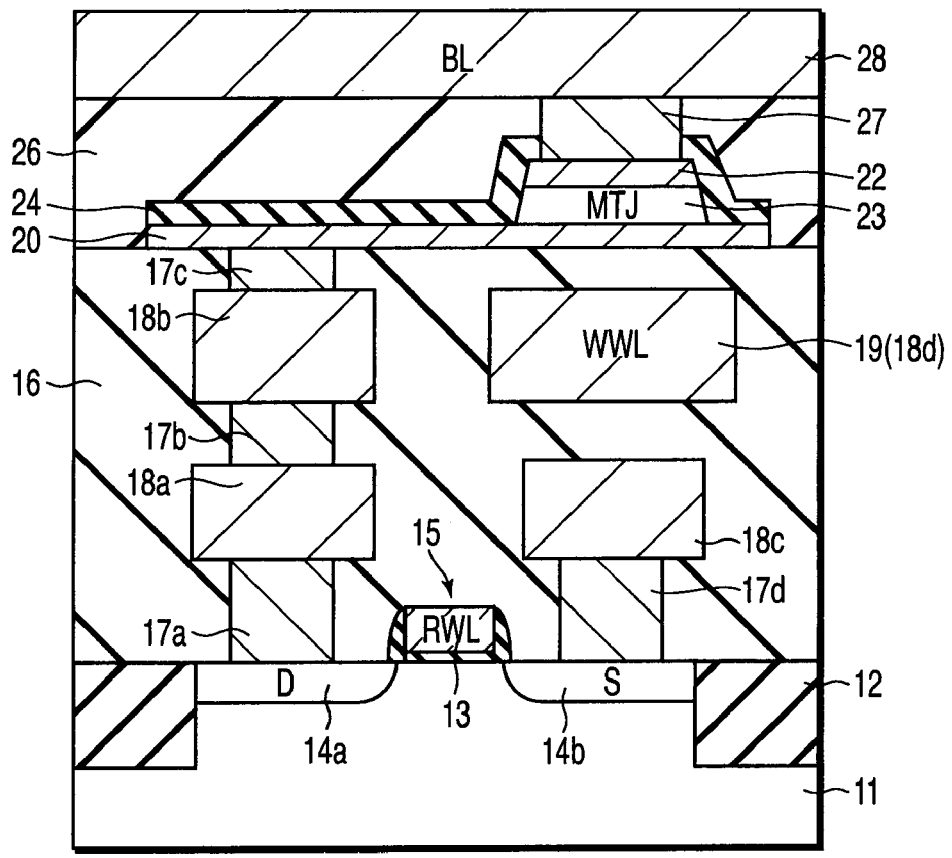
FIG. 2 is a sectional view of the magnetic random access memory taken along a line II-II in FIG. 1.

FIG. 1 is a schematic plan view of a magnetic random access memory according to the first embodiment of the present invention. FIG. 2 is a sectional view taken along a line II-II in FIG. 1. The structure of the magnetic random access memory according to the first embodiment will be described below.

As shown in FIGS. 1 and 2, a bit line (BL) 28 runs in the X direction. A write word line (WWL) 19 runs in the Y direction. An MTJ element (MTJ) 23 is arranged near the intersection between the bit line 28 and the write word line 19. A lower electrode 20 is arranged under the MTJ element 23. An upper electrode 22 is arranged on the MTJ element 23. The upper electrode 22 is connected to the bit line 28 through a contact 27. The lower electrode 20 is connected to a drain diffusion layer 14a of a MOSFET 15 through contacts 17a, 17b, and 17c and interconnections 18a and 18b. A source diffusion layer 14b of the MOSFET 15 is connected to, e.g., ground through a contact 17d and an interconnection 18c.

In this memory cell, a protective film 24 is formed on the upper surface of the lower electrode 20 in a region without the MTJ element 23, the side surfaces of the MTJ element 23 and upper electrode 22, and the upper surface of the upper electrode 22 in a region without the contact 27. That is, the side surfaces of the MTJ element 23 are covered with the protective film 24. The protective film 24 isolates the MTJ element 23 from an interlayer film 26. Since the protective film 24 and lower electrode 20 are processed at once, the protective film 24 has almost the same planar shape as that of the lower electrode 20. The side surfaces of the protective film 24 almost coincide with those of the lower electrode 20. The protective film 24 is preferably a sputtering insulating film formed by sputtering, a plasma CVD (Chemical Vapor Deposition) insulating film formed by plasma CVD, or an ALD (Atomic Layer Deposition) insulating film formed by ALD and is made of, e.g., $AlO_X$ film (e.g., $Al_2O_3$ film), SiN film, or $SiO_2$ film.

Since the MTJ element 23 and upper electrode 22 are processed at once, MTJ element 23 has almost the same planar shape as that of the upper electrode 22. The side surfaces of the MTJ element 23 almost coincide with those of the upper electrode 22.

FIGS. 3 and 4 are sectional views showing steps in manufacturing the magnetic random access memory according to the first embodiment of the present invention. The method of manufacturing the magnetic random access memory according to the first embodiment will be described below.

First, as shown in FIG. 3, an element isolation region 12 having an STI (Shallow Trench Isolation) structure is formed in a semiconductor substrate (e.g., a silicon substrate) 11. Next, the MOSFET 15 is formed on the semiconductor substrate 11. The MOSFET 15 includes a gate electrode 13 which functions as a read word line (RWL), and the drain and source diffusion layers 14a and 14b. The contacts 17a, 17b, 17c, and 17d and interconnections 18a, 18b, 18c, and 18d are formed in an interlayer film 16 made of, e.g., an $SiO_2$ film or D-TEOS (Densified-Tetra Ethyl Ortho Silicate). The interconnection 18d functions as the write word line (WWL) 19. The write word line 19 is formed from a multilayered film made of, e.g., TiN (10 nm)/Ti (10 nm)/AlCu (400 nm)/Ti (10 nm).

Next, the lower electrode 20 which is made of, e.g., Ta and has a thickness of, e.g., 30 nm is formed on the interlayer film 16 and contact 17c. An MTJ material layer 21 is formed on the lower electrode 20. The MTJ material layer 21 is formed from a multilayered film made of, e.g., NiFe (4 nm)/$Al_2O_3$ (2 nm)/CoFe (3 nm)/PtMn (20 nm)/NiFe (1 nm). In addition, the upper electrode 22 which is made of, e.g., Ta and has a thickness of, e.g., 100 nm is formed on the MTJ material layer 21.

As shown in FIG. 4, at least part of the MTJ material layer 21 (in the example shown in FIG. 4, the entire MTJ material layer 21) and the upper electrode 22 are processed into desired dimensions by, e.g., photolithography and RIE (Reactive Ion Etching). Accordingly, the MTJ element 23 junction-isolated for each cell is formed. Subsequently, in the etching apparatus which has processed at least part of the MTJ material layer 21, the protective film 24 having a thickness of, e.g., 30 nm is formed by sputtering in a consistently vacuum state. Examples of the material of the protective film 24 are insulating films such as an $Al_2O_3$ film, SiN film, and $SiO_2$ film. After that, in the etching apparatus which has processed at least part of the MTJ material layer 21, the protective film 24 and lower electrode 20 are processed into desired dimensions at once by, e.g., photolithography and RIE.

The description "the etching apparatus which has processed at least part of the MTJ material layer 21" is used because processing the MTJ material layer 21 made of, e.g., NiFe (4 nm)/Al$_2$O$_3$ (2 nm)/CoFe (3 nm)/PtMn (20 nm)/NiFe (1 nm) includes processing the entire MTJ material layer 21 (FIG. 4) and processing part of the MTJ material layer 21 (e.g., processing only NiFe (4 nm) or processing up to CoFe (3 nm)).

Next, as shown in FIG. 2, the interlayer film 26 made of, e.g., SiO$_2$ film is formed by, e.g., HDP (High Density Plasma)-CVD. The contact 27 connected to the upper electrode 22 through the protective film 24 is formed. The bit line 28 connected to the contact 27 is formed. The bit line 28 is formed from a multilayered film made of, e.g., TiN (10 nm)/Ti (10 nm)/AlCu (400 nm)/Ti (10 nm). In this way, the memory cells of the magnetic random access memory according to the first embodiment are formed.

According to the first embodiment, the side surfaces of the MTJ element 23 are covered with the protective film 24 so that the MTJ element 23 is isolated from the interlayer film 26. Hence, any intrusion of outgas (e.g., H$_2$O) from the interlayer film 26 into the MTJ element 23 can be suppressed by the protective film 24. In addition, when the apparatus which has processed at least part of the MTJ element 23 is continuously used to form the protective film 24 which covers the side surfaces of the MTJ element 23, the side surfaces of the MTJ element 23 can be prevented from being exposed to air and oxidized. Furthermore, when the protective film 24 is formed by using, e.g., sputtering, oxidation during film formation can be suppressed. As a result, the degradation in the characteristics of the magnetic material in the junction isolation sidewall and the tunnel insulating film of the MTJ element 23 can be suppressed. Accordingly, the degradation in the magnetic characteristics of the MTJ element 23 can be suppressed.

The protective film 24 and lower electrode 20 may be processed separately. For example, as shown in FIG. 5, the protective film 24 may be processed such that it remains on only the side surfaces of the MTJ element 23 and upper electrode 22.

As shown in FIG. 6, a barrier metal film 30 made of, e.g., TiN may be formed around the contact 27.

The upper and lower surfaces of the MTJ element 23 need not always be in direct contact with the upper electrode 22 and lower electrode 20. For example, a layer made of a conductive material may be inserted between the MTJ element 23 and the lower electrode 20 or between the MTJ element 23 and the upper electrode 22.

Second Embodiment

In the second embodiment, the protective film which protects an MTJ element from outgas from the interlayer film has a multilayered structure.

Figure 7:
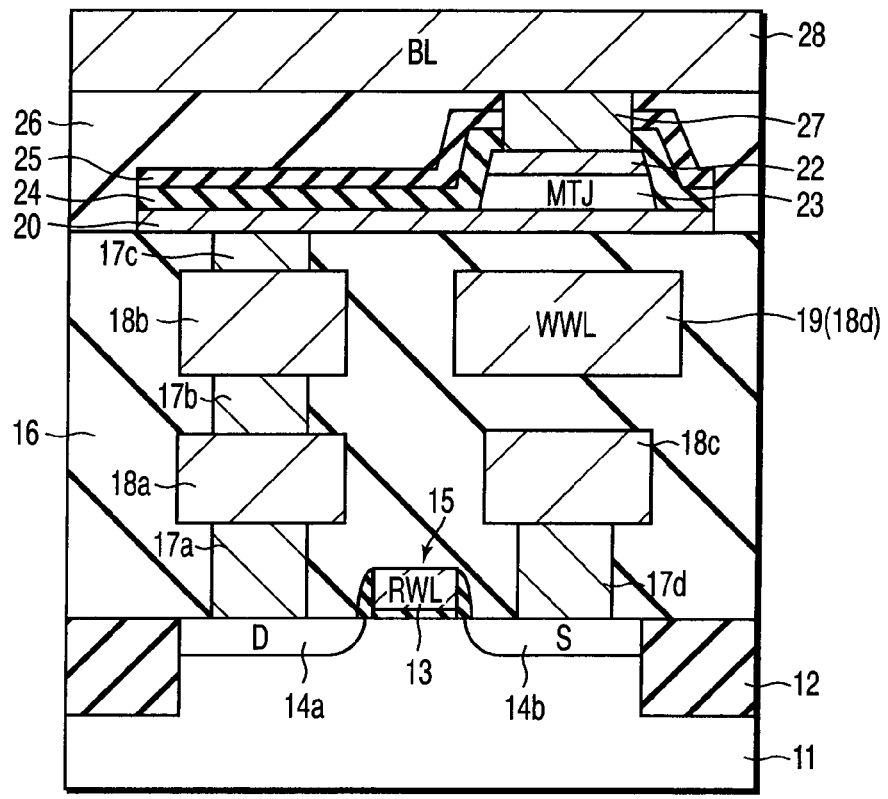
FIG. 7 is a sectional view showing a magnetic random access memory according to the second embodiment of the present invention.

FIG. 7 is a sectional view of a magnetic random access memory according to the second embodiment of the present invention. The structure of the magnetic random access memory according to the second embodiment will be described below.

As shown in FIG. 7, the second embodiment is different from the first embodiment in that protective films 24 and 25 which protect an MTJ element 23 have a multilayered structure (e.g., a two-layered structure). The structure will be described below in detail.

The first protective film 24 is formed on the upper surface of a lower electrode 20 in a region without the MTJ element 23, the side surfaces of the MTJ element 23 and an upper electrode 22, and the upper surface of the upper electrode 22 in a region without a contact 27. The second protective film 25 is formed on the first protective film 24. That is, the two protective films 24 and 25 are formed between the MTJ element 23 and the interlayer film.

Since the first and second protective films 24 and 25 and the lower electrode 20 are processed at once, the first and second protective films 24 and 25 have almost the same planar shape as that of the lower electrode 20. The side surfaces of the first and second protective films 24 and 25 almost coincide with those of the lower electrode 20.

The first protective film 24 is, e.g., a sputtering insulating film formed by sputtering, a plasma CVD insulating film formed by plasma CVD, or an ALD insulating film formed by ALD. The second protective film 25 is, e.g., a sputtering insulating film formed by sputtering, a plasma CVD insulating film formed by plasma CVD, or an ALD insulating film formed by ALD.

The first and second protective films 24 and 25 are preferably formed from different materials. The first protective film/second protective film is made of, e.g., an AlO$_X$ film/SiN film, AlO$_X$ film/SiO$_2$ film, SiN film/AlO$_X$ film, SiN film/SiO$_2$ film, SiO$_2$ film/AlO$_X$ film, or SiO$_2$ film/SiN film.

The first protective film 24 may be made of a material having tension while the second protective film 25 may be made of a material having stress. Conversely, the first protective film 24 may be made of a material having stress while the second protective film 25 may be made of a material having tension. An example of the material having tension is a nitride film. An example of the material having stress is an oxide film. As described above, when one of the first and second protective films 24 and 25 is made of a material having tension, and the other is made of a material having stress, stress applied to the first and second protective films 24 and 25 can cancel each other. As a result, stress received by the MTJ element 23 can be reduced, and the magnetostriction effect of the MTJ element 23 can be suppressed.

The first protective film 24 may be made of a material having a thermal resistance lower than that of the second protective film 25. When the thermal resistance of the protective film 24 closer to the MTJ element 23 is made low, variations in characteristics caused by heat generated during the operation of the MTJ element 23 can be suppressed. Alternatively, the second protective film 25 may be made of a material having a thermal resistance lower than that of the first protective film 24.

The first and second protective films 24 and 25 may have almost the same thickness or different thicknesses. When the thicknesses are different, the first protective film 24 may be thicker than the second protective film 25, or the second protective film 25 may be thicker than the first protective film 24.

Figure 8:
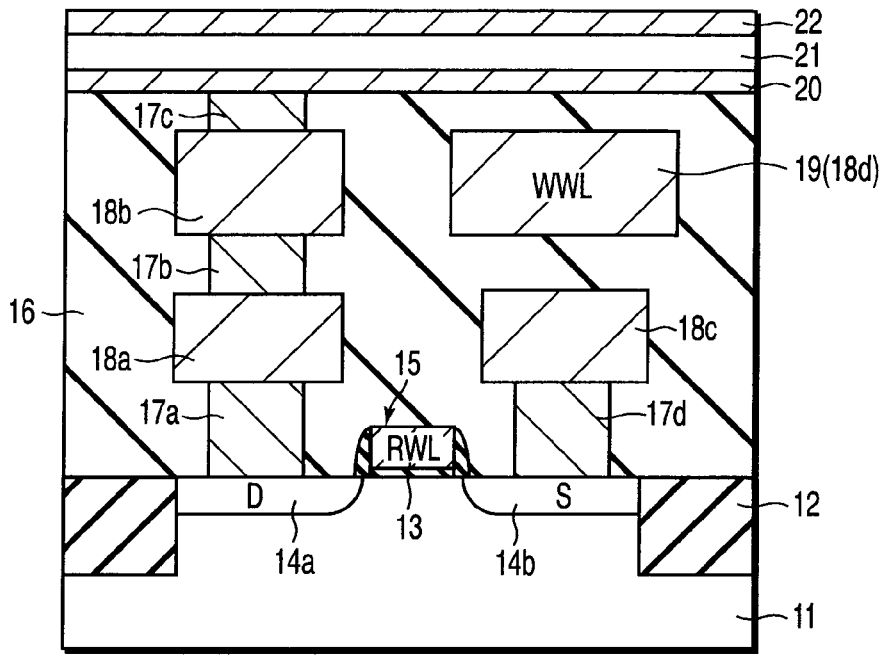
FIG. 8 is a sectional view showing a step in manufacturing the magnetic random access memory according to the second embodiment of the present invention.

FIGS. 8 and 9 are sectional views showing steps in manufacturing the magnetic random access memory according to the second embodiment of the present invention. The method of manufacturing the magnetic random access memory according to the second embodiment will be described below.

First, as shown in FIG. 8, the lower electrode 20 which is made of, e.g., Ta and has a thickness of, e.g., 30 nm is formed on an interlayer film 16 and a contact 17c, as in the first embodiment. An MTJ material layer 21 is formed on the lower electrode 20. In addition, the upper electrode 22 which is made of, e.g., Ta and has a thickness of, e.g., 100 nm is formed on the MTJ material layer 21.

As shown in FIG. 9, at least part of the MTJ material layer 21 (in the example shown in FIG. 9, the entire MTJ material layer 21) and the upper electrode 22 are processed into desired dimensions by, e.g., photolithography and RIE. Accordingly, the MTJ element 23 junction-isolated for each cell is formed. Subsequently, in the etching apparatus which has processed at least part of the MTJ material layer 21, the first and second protective films 24 and 25 are sequentially formed in a consistently vacuum state. After that, in the etching apparatus which has processed at least part of the MTJ material layer 21, the first and second protective films 24 and 25 and the lower electrode 20 are processed into desired dimensions at once by, e.g., photolithography and RIE. The second protective film 25 may be formed by an apparatus different from the etching apparatus which has processed at least part of the MTJ material layer 21.

Next, as shown in FIG. 7, the interlayer film 26 made of, e.g., $SiO_2$ film is formed by, e.g., HDP-CVD. The contact 27 connected to the upper electrode 22 through the protective film 24 is formed. A bit line 28 connected to the contact 27 is formed. In this way, the memory cells of the magnetic random access memory according to the second embodiment are formed.

When detailed samples 1 to 6 of the first and second protective films 24 and 25 are used, the first and second protective films 24 and 25 are formed by the following film formation process.

(a) Sample 1

In sample 1, the first protective film 24 and the second protective film 25 are an $Al_2O_3$ film and an SiN film, respectively, as shown in FIG. 10.

In this case, in the apparatus which has processed at least part of the MTJ material layer 21, the first protective film 24 made of $Al_2O_3$ is formed to a thickness of, e.g., 20 nm by sputtering in a consistently vacuum state. Subsequently, the second protective film 25 made of SiN is formed to a thickness of, e.g., 20 nm by sputtering in the consistently vacuum state. The second protective film 25 made of SiN may be deposited by plasma CVD after breaking the atmosphere.

(b) Sample 2

In sample 2, the first protective film 24 and the second protective film 25 are an $Al_2O_3$ film and an $SiO_2$ film, respectively, as shown in FIG. 11.

In this case, in the apparatus which has processed at least part of the MTJ material layer 21, the first protective film 24 made of $Al_2O_3$ is formed to a thickness of, e.g., 20 nm by sputtering in a consistently vacuum state. Subsequently, the second protective film 25 made of $SiO_2$ is formed to a thickness of, e.g., 20 nm by sputtering in the consistently vacuum state. The second protective film 25 made of $SiO_2$ may be deposited by plasma CVD after breaking the atmosphere.

(c) Sample 3

Figure 12:
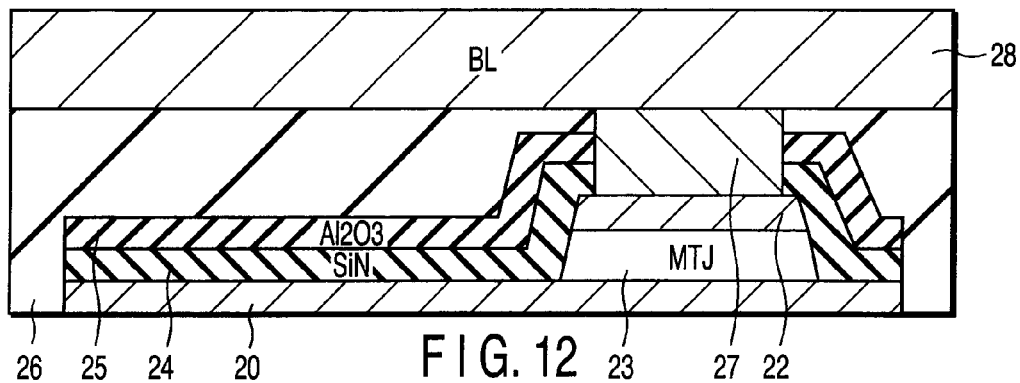
FIG. 12 is a partial sectional view showing sample 3 of the magnetic random access memory according to the second embodiment of the present invention.

In sample 3, the first protective film 24 and the second protective film 25 are an SiN film and an $Al_2O_3$ film, respectively, as shown in FIG. 12.

In this case, in the apparatus which has processed at least part of the MTJ material layer 21, the first protective film 24 made of SiN is formed to a thickness of, e.g., 20 nm by sputtering in a consistently vacuum state. Subsequently, the second protective film 25 made of $Al_2O_3$ is formed to a thickness of, e.g., 20 nm by sputtering in the consistently vacuum state. The second protective film 25 made of $Al_2O_3$ may be deposited by ALD after breaking the atmosphere.

(d) Sample 4

Figure 13:
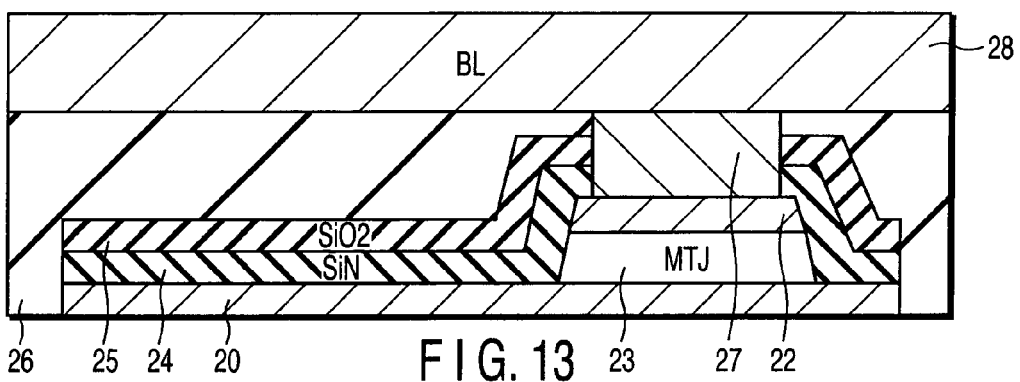
FIG. 13 is a partial sectional view showing sample 4 of the magnetic random access memory according to the second embodiment of the present invention.

In sample 4, the first protective film 24 and the second protective film 25 are an SiN film and an $SiO_2$ film, respectively, as shown in FIG. 13.

In this case, in the apparatus which has processed at least part of the MTJ material layer 21, the first protective film 24 made of SiN is formed to a thickness of, e.g., 20 nm by sputtering in a consistently vacuum state. Subsequently, the second protective film 25 made of $SiO_2$ is formed to a thickness of, e.g., 20 nm by sputtering in the consistently vacuum state. The second protective film 25 made of $SiO_2$ may be deposited by plasma CVD after breaking the atmosphere.

(e) Sample 5

Figure 14:
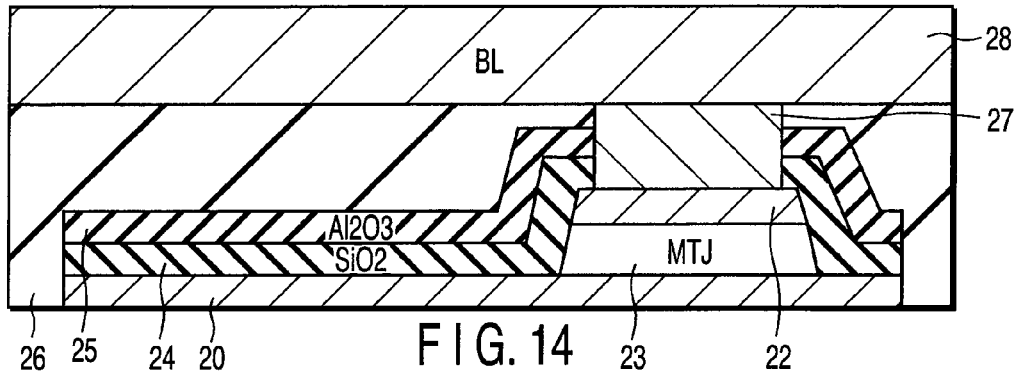
FIG. 14 is a partial sectional view showing sample 5 of the magnetic random access memory according to the second embodiment of the present invention.

In sample 5, the first protective film 24 and the second protective film 25 are an $SiO_2$ film and an $Al_2O_3$ film, respectively, as shown in FIG. 14.

In this case, in the apparatus which has processed at least part of the MTJ material layer 21, the first protective film 24 made of $SiO_2$ is formed to a thickness of, e.g., 20 nm by sputtering in a consistently vacuum state. Subsequently, the second protective film 25 made of $Al_2O_3$ is formed to a thickness of, e.g., 20 nm by sputtering in the consistently vacuum state. The second protective film 25 made of $Al_2O_3$ may be deposited by ALD after breaking the atmosphere.

(f) Sample 6

Figure 15:
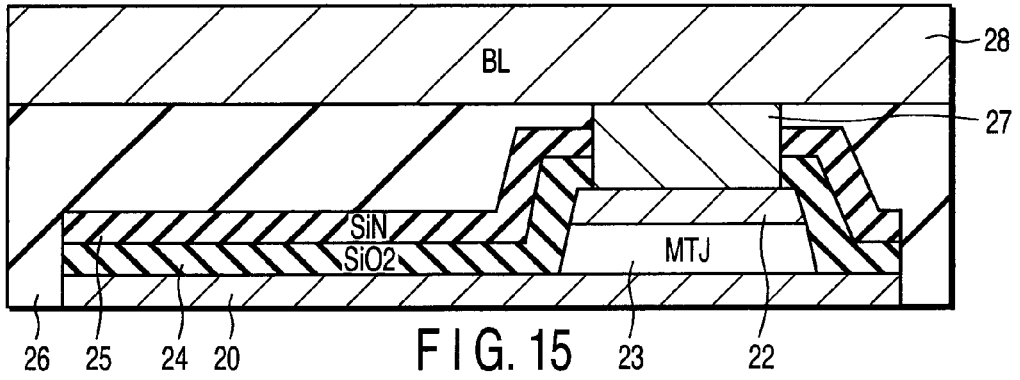
FIG. 15 is a partial sectional view showing sample 6 of the magnetic random access memory according to the second embodiment of the present invention.

In sample 6, the first protective film 24 and the second protective film 25 are an $SiO_2$ film and an SiN film, respectively, as shown in FIG. 15.

In this case, in the apparatus which has processed at least part of the MTJ material layer 21, the first protective film 24 made of $SiO_2$ is formed to a thickness of, e.g., 20 nm by sputtering in a consistently vacuum state. Subsequently, the second protective film 25 made of SiN is formed to a thickness of, e.g., 20 nm by sputtering in the consistently vacuum state. The second protective film 25 made of SiN may be deposited by plasma CVD after breaking the atmosphere.

According to the second embodiment, the same effect as in the first embodiment can be obtained. In the second embodiment, the protective films 24 and 25 have a multilayered structure. Since the second protective film 25 can block outgas which cannot be blocked by the first protective film 24, the barrier effect against intruding outgas can be increased.

Figure 16:
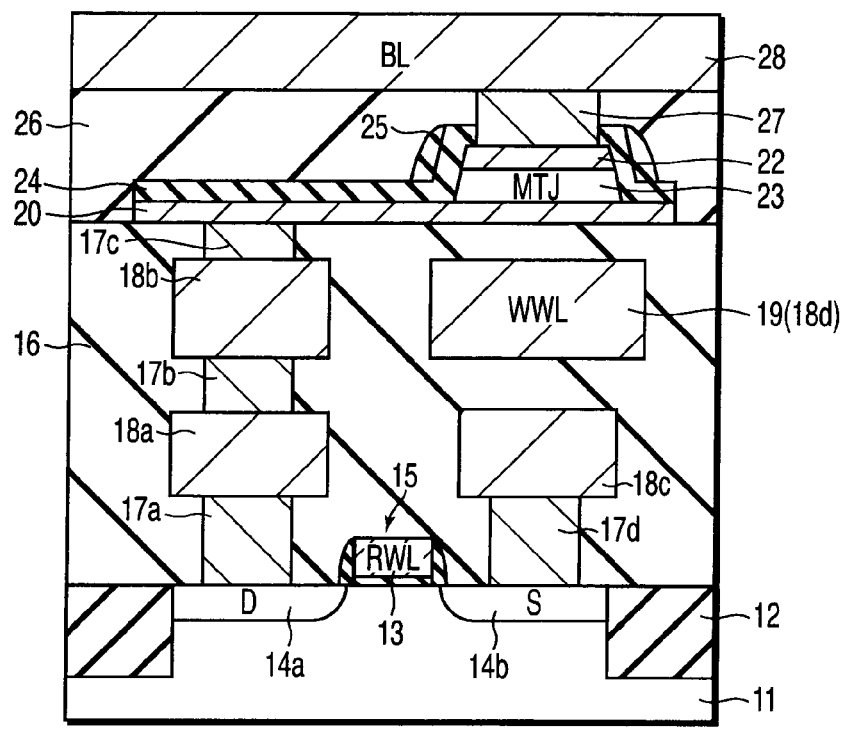
FIG. 16 is a sectional view showing a structure in which a second protective film remains on only the first protective film at the upper portion of the side surfaces of the MTJ element and upper electrode in the magnetic random access memory according to the second embodiment of the present invention.

The first and second protective films 24 and 25 may be processed separately. For example, as shown in FIG. 16, the second protective film 25 may be processed such that it remains on only the first protective film 24 at the upper portion of the side surfaces of the MTJ element 23 and upper electrode 22.

Figure 17:
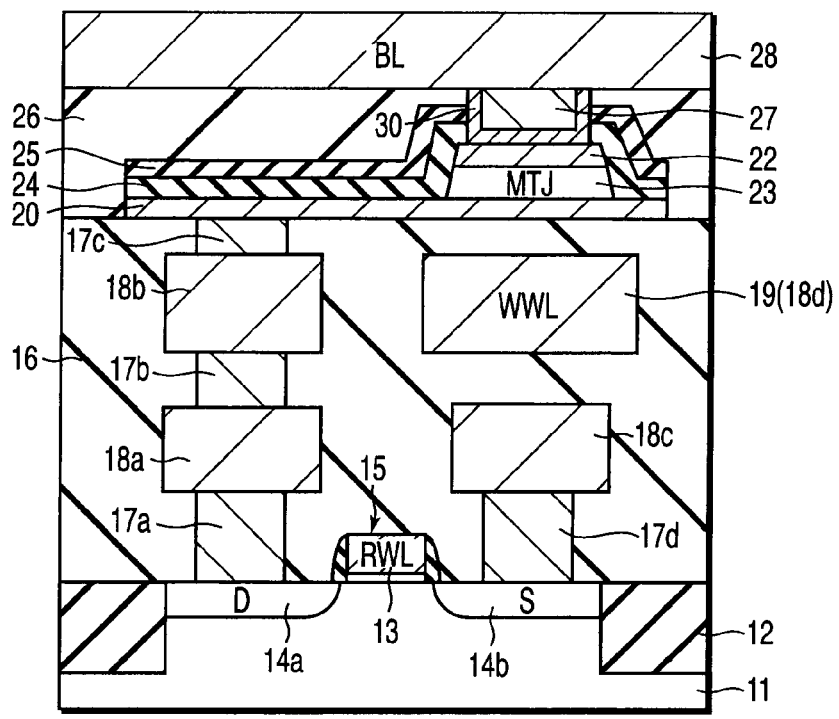
FIG. 17 is a sectional view showing a structure in which a barrier metal of a contact is formed in the magnetic random access memory according to the second embodiment of the present invention.

As shown in FIG. 17, a barrier metal film 30 made of, e.g., TiN may be formed around the contact 27.

The protective film may have a multilayered structure including three or more layers. For example, as shown in FIG. 18, a three-layered structure including protective films 24, 25, and 31 may be formed. In this case, to increase the barrier effect against intruding outgas, the protective films 24, 25, and 31 are preferably made of different materials.

Third Embodiment

In the third embodiment, an MTJ element will be described in detail. Various kinds of MTJ elements to be described in the third embodiment can be applied to the first, second, and fourth embodiments.

(a) Basic Structure of MTJ Element

FIGS. 19A and 19B are sectional views of a basic MTJ element according to the third embodiment of the present invention. The basic structure of the MTJ element will be described below.

As shown in FIGS. 19A and 19B, an MTJ element 23 has at least a fixed layer (pinned layer) 42 with fixed magnetization, a recording layer (free layer) 44 whose magnetization direction is reversed, and an intermediate layer 43 (e.g., a tunnel insulating layer) sandwiched between the fixed layer 42 and the recording layer 44. In addition, an anti-ferromagnetic layer 41 to fix the magnetization of the fixed layer 42 is formed under the fixed layer 42.

The MTJ element 23 can achieve a parallel state (FIG. 19A) in which the magnetization directions of the fixed layer 42 and recording layer 44 are the same, and an anti-parallel state (FIG. 19B) in which the magnetization directions of the fixed layer 42 and recording layer 44 are reverse. If the parallel state is defined as a "1" state, and the anti-parallel state is defined as a "0" state, binary data can be written.

Each of the fixed layer 42 and recording layer 44 may have either a single-layered structure made of a ferromagnetic material as shown in FIGS. 19A and 19B or a multilayered structure including a plurality of ferromagnetic materials.

(b) Tunnel Junction Structure

FIGS. 20A and 20B are sectional views showing the tunnel junction structure of the MTJ element according to the third embodiment of the present invention. The tunnel junction structure of the MTJ element will be described below.

As shown in FIGS. 20A and 20B, the MTJ element 23 may have either a single tunnel junction structure or a double tunnel junction structure.

As shown in FIG. 20A, the MTJ element 23 having a single tunnel junction structure has one intermediate layer 43 functioning as a tunnel junction layer.

As shown in FIG. 20B, the MTJ element 23 having a double tunnel junction structure has intermediate layers 43a and 43b functioning as tunnel junction layers. Hence, the intermediate layer 43a is formed on one side of the recording layer 44, and a first fixed layer 42a is formed on the intermediate layer 43a. The intermediate layer 43b is formed on the other side of the recording layer 44, and a second fixed layer 42b is formed on the intermediate layer 43b.

(c) Interlayer Coupling Structure

FIGS. 21A to 21H are sectional views showing the interlayer coupling structure of the MTJ element according to the third embodiment of the present invention. The interlayer coupling structure of the MTJ element will be described below.

As shown in FIGS. 21A to 21H, in the MTJ element 23, one of the fixed layer 42 and recording layer 44 may have an anti-ferromagnetic coupling structure or a ferromagnetic coupling structure. In the anti-ferromagnetic coupling structure, interlayer coupling occurs such that the magnetization directions of two ferromagnetic layers which sandwich a nonmagnetic layer are anti-parallel. In the ferromagnetic coupling structure, interlayer coupling occurs such that the magnetization directions of two ferromagnetic layers which sandwich a nonmagnetic layer are parallel.

Figure 21A:
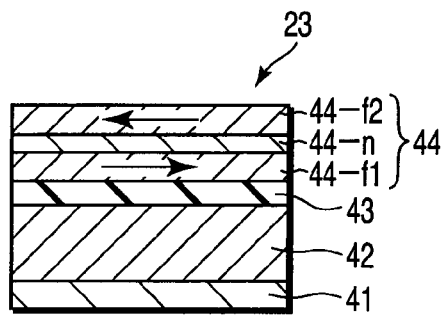
FIGS. 21A to 21H are sectional views showing the interlayer coupling structure of the MTJ element according to the third embodiment of the present invention.

In the MTJ element 23 shown in FIG. 21A, the recording layer 44 has the anti-ferromagnetic coupling structure. More specifically, the recording layer 44 has a three-layered structure including a ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are anti-parallel.

Figure 21B:
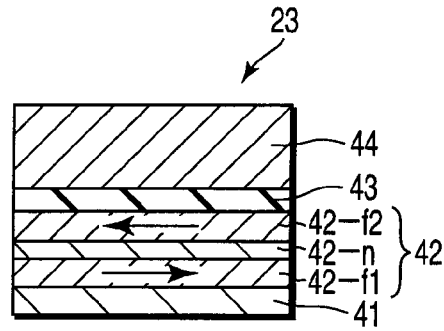

In the MTJ element 23 shown in FIG. 21B, the fixed layer 42 has the anti-ferromagnetic coupling structure. More specifically, the fixed layer 42 has a three-layered structure including a ferromagnetic layer 42-$f1$, nonmagnetic layer 42-$n$, and ferromagnetic layer 42-$f2$. They are magnetically coupled such that the magnetization directions of the ferromagnetic layers 42-$f1$ and 42-$f2$ are anti-parallel.

Figure 21C:
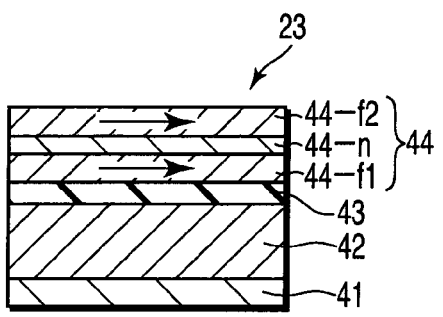

In the MTJ element 23 shown in FIG. 21C, the recording layer 44 has the ferromagnetic coupling structure. More specifically, the recording layer 44 has a three-layered structure including the ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are parallel.

Figure 21D:
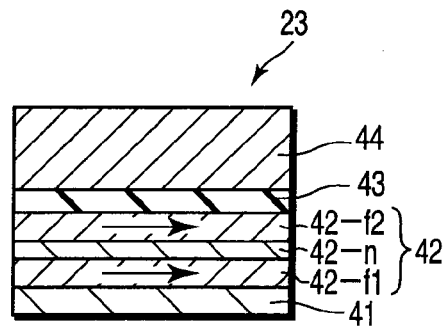

In the MTJ element 23 shown in FIG. 21D, the fixed layer 42 has the ferromagnetic coupling structure. More specifically, the fixed layer 42 has a three-layered structure including the ferromagnetic layer 42-$f1$, nonmagnetic layer 42-$n$, and ferromagnetic layer 42-$f2$. They are magnetically coupled such that the magnetization directions of the ferromagnetic layers 42-$f1$ and 42-$f2$ are parallel.

Figure 21E:
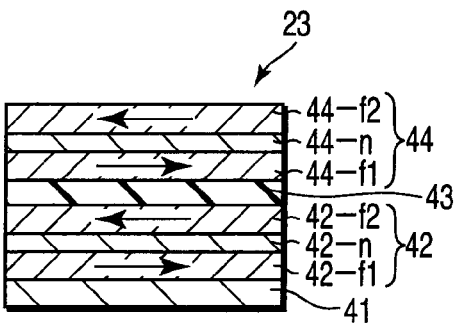

In the MTJ element 23 shown in FIG. 21E, both the recording layer 44 and the fixed layer 42 have the anti-ferromagnetic coupling structure. More specifically, the recording layer 44 has a three-layered structure including the ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are anti-parallel. The fixed layer 42 has a three-layered structure including the ferromagnetic layer 42-$f1$, nonmagnetic layer 42-$n$, and ferromagnetic layer 42-$f2$. They are magnetically coupled such that the magnetization directions of the ferromagnetic layers 42-$f1$ and 42-$f2$ are anti-parallel.

Figure 21F:
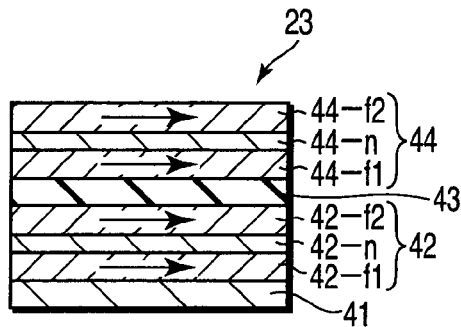

In the MTJ element 23 shown in FIG. 21F, both the recording layer 44 and the fixed layer 42 have the ferromagnetic coupling structure. More specifically, the recording layer 44 has a three-layered structure including the ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are parallel. The fixed layer 42 has a three-layered structure including the ferromagnetic layer 42-$f1$, nonmagnetic layer 42-$n$, and ferromagnetic layer 42-$f2$. They are magnetically coupled such that the magnetization directions of the ferromagnetic layers 42-$f1$ and 42-$f2$ are parallel.

Figure 21G:
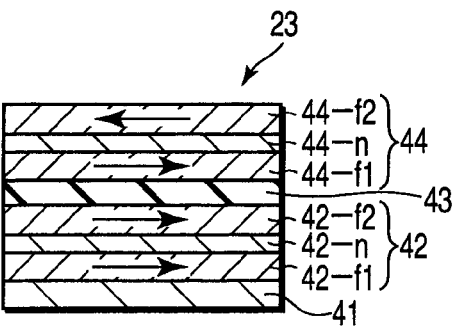

In the MTJ element 23 shown in FIG. 21G, the recording layer 44 has the anti-ferromagnetic coupling structure, and the fixed layer 42 has the ferromagnetic coupling structure. More specifically, the recording layer 44 has a three-layered structure including the ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are anti-parallel. The fixed layer 42 has a three-layered structure including the ferromagnetic layer 42-$f1$, nonmagnetic layer 42-$n$, and ferromagnetic layer 42-$f2$. They are magnetically coupled such that the magnetization directions of the ferromagnetic layers 42-$f1$ and 42-$f2$ are parallel.

Figure 21H:
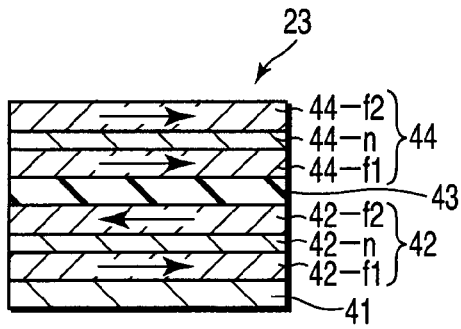

In the MTJ element 23 shown in FIG. 21H, the recording layer 44 has the ferromagnetic coupling structure, and the fixed layer 42 has the anti-ferromagnetic coupling structure. More specifically, the recording layer 44 has a three-layered structure including the ferromagnetic layer 44-$f1$, nonmagnetic layer 44-$n$, and ferromagnetic layer 44-$f2$. They are magnetically coupled such that the magnetization directions of the ferromagnetic layers 44-$f1$ and 44-$f2$ are parallel. The fixed layer 42 has a three-layered structure including the ferromagnetic layer 42-f1, nonmagnetic layer 42-n, and ferromagnetic layer 42-f2. They are magnetically coupled such that the magnetization directions of the ferromagnetic layers 42-f1 and 42-f2 are anti-parallel.

The MTJ element 23 having the single tunnel junction structure has been described with reference to FIGS. 21A to 21H. This can also be applied to the MTJ element 23 having the double tunnel junction structure. The fixed layer 42 or recording layer 44 need not always have a three-layered structure including a ferromagnetic layer, nonmagnetic layer, and ferromagnetic layer. The number of layers may be increased.

(d) Planar Shape

FIGS. 22A to 22D are plan views of the MTJ element according to the third embodiment of the present invention. Examples of the planar shape of the MTJ element will be described below. The MTJ element can have any other shape except those shown in FIGS. 22A to 22D.

Figure 22A:
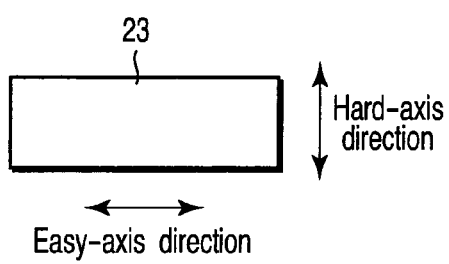
FIGS. 22A to 22D are plan views showing the MTJ element according to the third embodiment of the present invention.
Figure 22C:
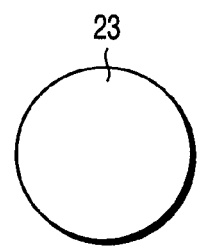
Figure 22D:
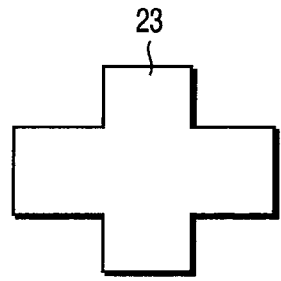

As shown in FIG. 22A, the planar shape of the MTJ element 23 is, e.g., rectangular. In this rectangular shape, the longitudinal direction is the easy-axis direction, and the direction perpendicular to the longitudinal direction is the hard-axis direction. The planar shape of the MTJ element 23 may be elliptical (FIG. 22B), circular (FIG. 22C), or crossed (FIG. 22D).

In arranging the MTJ element 23 in a memory cell, the easy-axis direction of the MTJ element 23 may be aligned along the running direction of the bit line or the running direction of the word line.

(e) Sectional Shape

Figure 23A:
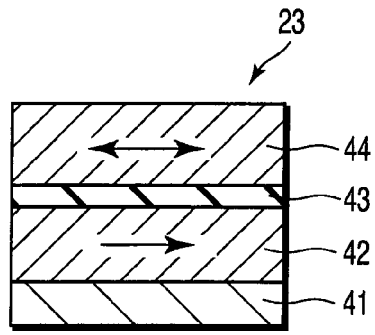
FIGS. 23A to 23C are sectional views showing the MTJ element according to the third embodiment of the present invention.
Figure 22B:
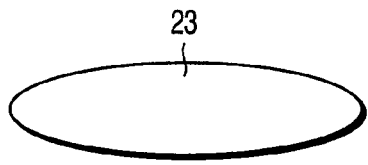
Figure 23B:
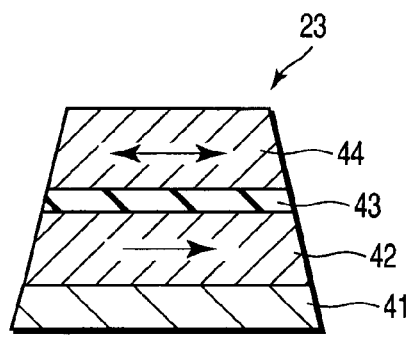
Figure 23C:
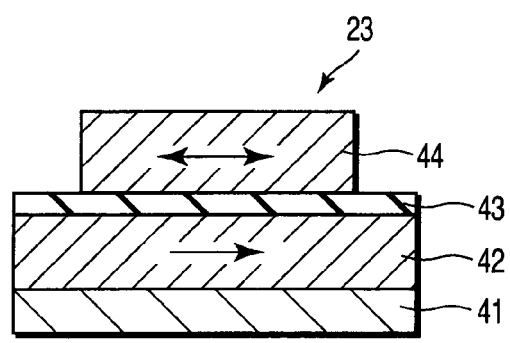

FIGS. 23A to 23C are sectional views of the MTJ element according to the third embodiment of the present invention. The sectional shape of the MTJ element 23 will be described below.

In the MTJ element 23, all the side surfaces of the anti-ferromagnetic layer 41, fixed layer 42, intermediate layer 43, and recording layer 44 may continuously be flush with each other (FIGS. 23A and 23B). Alternatively, the side surfaces of the anti-ferromagnetic layer 41, fixed layer 42, intermediate layer 43, and recording layer 44 may be discontinuous (FIG. 23C).

When the MTJ element 23 shown in FIG. 23A is viewed from the upper side, all the anti-ferromagnetic layer 41, fixed layer 42, intermediate layer 43 and recording layer 44 have the same planar shape.

When the MTJ element 23 shown in FIG. 23B is viewed from the upper side, the planar shapes of the anti-ferromagnetic layer 41, fixed layer 42, intermediate layer 43 and recording layer 44 become smaller toward the top. That is, the sectional shape is trapezoidal.

The sectional shape shown in FIG. 23C is convex. When the MTJ element 23 is viewed from the upper side, the planar shape of the anti-ferromagnetic layer 41, fixed layer 42, and intermediate layer 43 is larger than that of the recording layer 44.

(f) Material

As the material of the fixed layer 42 and recording layer 44, for example, Fe, Co, Ni, or an alloy thereof, magnetite having a high spin polarizability, an oxide such as $CrO_2$ or $RXMnO_{3-Y}$ (R: rare earth element, X: Ca, Ba, or Sr), or a Heusler alloy such as NiMnSb or PtMnSb is preferably used. The magnetic materials may contain a small amount of non-magnetic element such as Ag, Cu, Au, Al, Mg, Si, Bi, Ta, B, C, O, N, Pd, Pt, Zr, Ir, W, Mo, or Nb as long as the ferromagnetism is not lost.

As the material of the anti-ferromagnetic layer 41, Fe—Mn, Pt—Mn, Pt—Cr—Mn, Ni—Mn, Ir—Mn, NiO, $Fe_2O_3$, or the like is preferably used.

As the material of the intermediate layer 43, various dielectric materials such as $Al_2O_3$, $SiO_2$, MgO, AlN, $Bi_2O_3$, $MgF_2$, $CaF_2$, $SrTiO_2$, or $AlLaO_3$ can be used. These dielectric materials may contain oxygen, nitrogen, or fluorine defects.

Fourth Embodiment

In the fourth embodiment, a memory cell will be described in detail.

(a) Select Transistor Memory Cell

Figure 24:
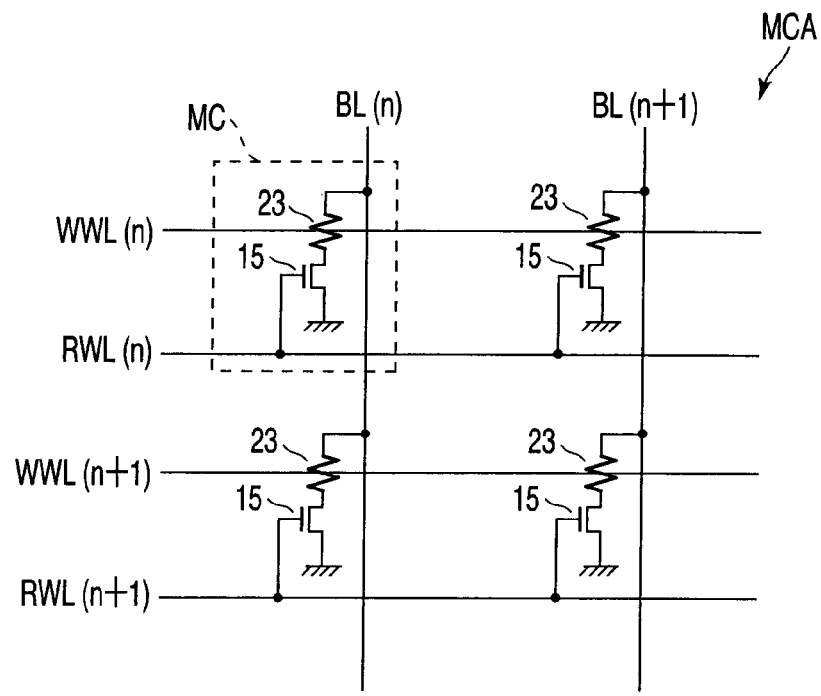
FIG. 24 is a circuit diagram showing a select transistor memory cell array of a magnetic random access memory according to the fourth embodiment of the present invention.

FIG. 24 shows a select transistor memory cell array in a magnetic random access memory according to the fourth embodiment of the present invention. The select transistor cell structure will be described below.

As shown in FIG. 24, one select transistor cell MC of the select transistor memory cell array includes one MTJ element 23, and a transistor (e.g., a MOSFET) 15, bit line BL, and word lines WWL and RWL which are connected to the MTJ element 23. The select transistor cell MC has the sectional structure shown in FIG. 2 or the like.

In this select transistor memory cell, data is written/read in the following way.

The write operation is executed in the following way. The write word line WWL and bit line BL corresponding to a selected one of the plurality of MTJ elements 23 are selected. When write currents Iw1 and Iw2 are supplied to the selected bit line BL and write word line WWL, respectively, a synthetic field H by the write currents Iw1 and Iw2 is applied to the MTJ element 23. The magnetization of a recording layer 44 of the MTJ element 23 is inverted so that the magnetization directions of a fixed layer 42 and the recording layer 44 are parallel or anti-parallel. If the parallel state is defined as a "1" state (FIG. 19A), and the anti-parallel state is defined as a "0" state (FIG. 19B), binary data can be written.

The read operation is executed in the following way. The bit line BL and read word line RWL corresponding to the selected MTJ element 23 are selected. A read current Ir is supplied to the MTJ element 23. When the magnetization of the MTJ element 23 is in the parallel state (e.g., the "1" state), the resistance is low. In the anti-parallel state (e.g., the "0" state), the resistance is high. The difference between the resistances is read to determine the "1" or "0" state of the MTJ element 23.

(b) Select Diode Memory Cell

Figure 25A:
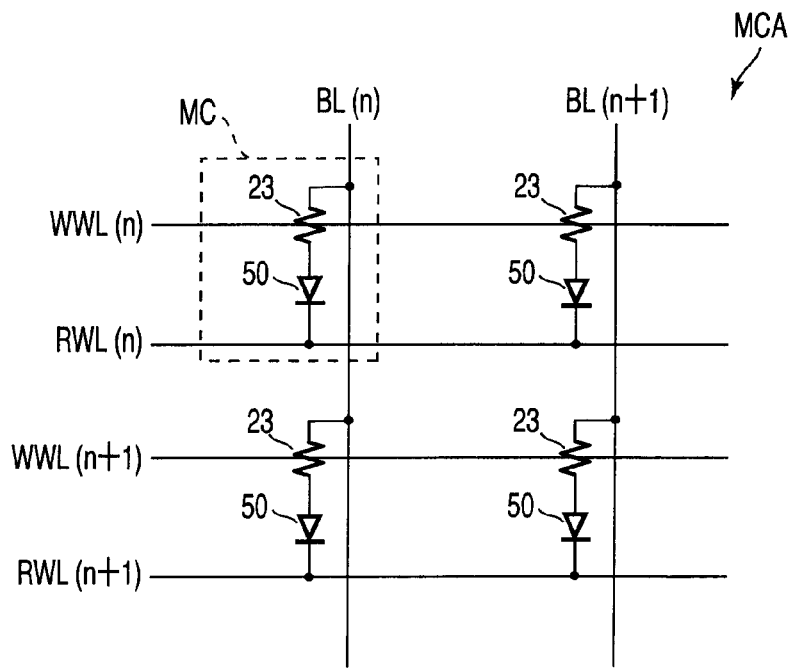
Figure 25B:
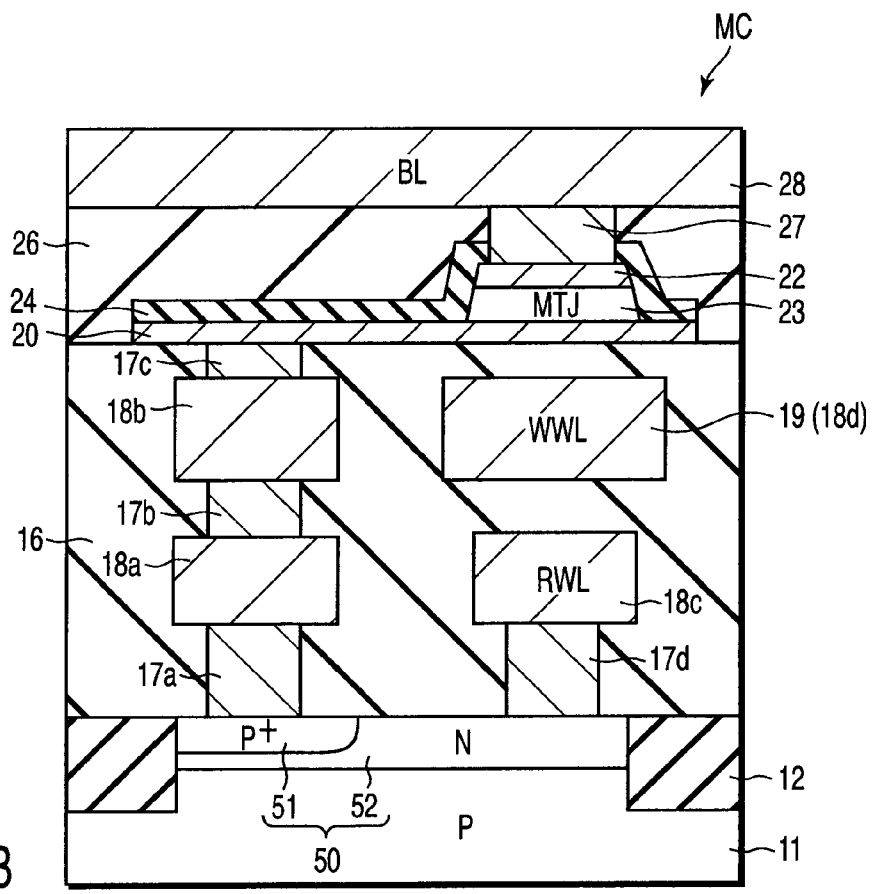

FIGS. 25A and 25B show a select diode cell in the magnetic random access memory according to the fourth embodiment of the present invention. The select diode cell structure will be described below.

As shown in FIGS. 25A and 25B, one select diode cell MC includes one MTJ element 23, and a diode (D) 50, the bit line BL, and the word lines WWL and RWL which are connected to the MTJ element.

The diode 50 is, e.g., a p-n junction diode including a p-type diffusion layer 51 and an n-type diffusion layer 52 formed in a semiconductor substrate 11. The p-type diffusion layer 51 of the diode 50 is connected to the MTJ element 23 through contacts 17a, 17b, and 17c, interconnections 18a and 18b, and lower electrode 20. On the other hand, the n-type diffusion layer 52 of the diode 50 is connected to a read word line (RWL) 18c through a contact 17d. In the structure shown in FIGS. 25A and 25B, a current flows from the bit line BL to the read word line RWL.

The position and direction of the diode 50 can variously be changed. For example, the diode 50 may be arranged in a direction in which the current flows from the read word line RWL to the bit line BL. The diode 50 need not always be formed in the semiconductor substrate 11. The diode 50 may be arranged on or under the MTJ element 23.

In the select diode memory cell, the data write operation is the same as that of the select transistor memory cell. The write currents Iw1 and Iw2 are supplied to the bit line BL and write word line WWL to made the magnetization of the MTJ element 23 parallel or anti-parallel. The data read operation is also almost the same as that of the select transistor memory cell. In the select diode memory cell, however, the biases of the bit line BL and read word line RWL are controlled to set unselected MTJ elements in a reverse-biased state by using the rectifying effect of the diode 50 such that the current flows to only the selected MTJ element 23.

(c) Cross-Point Memory Cell

Figure 26A:
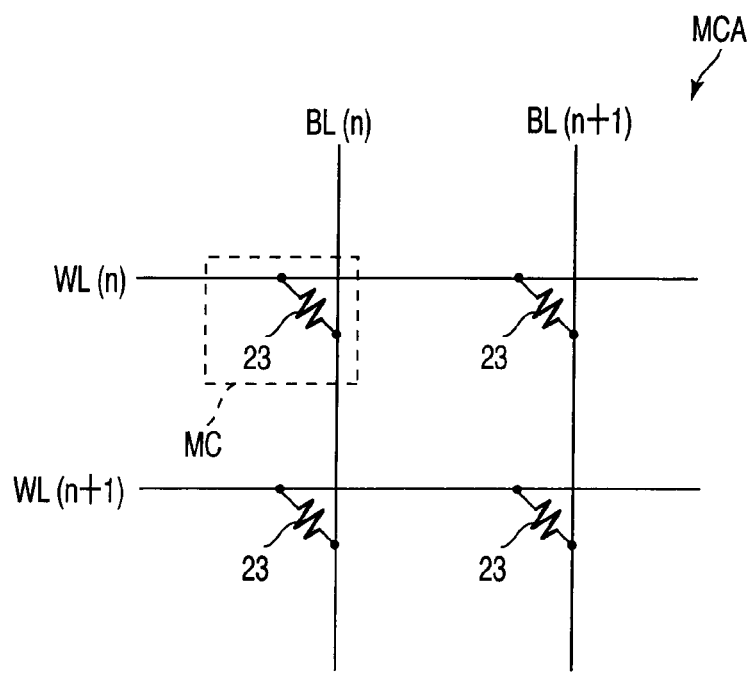
Figure 26B:
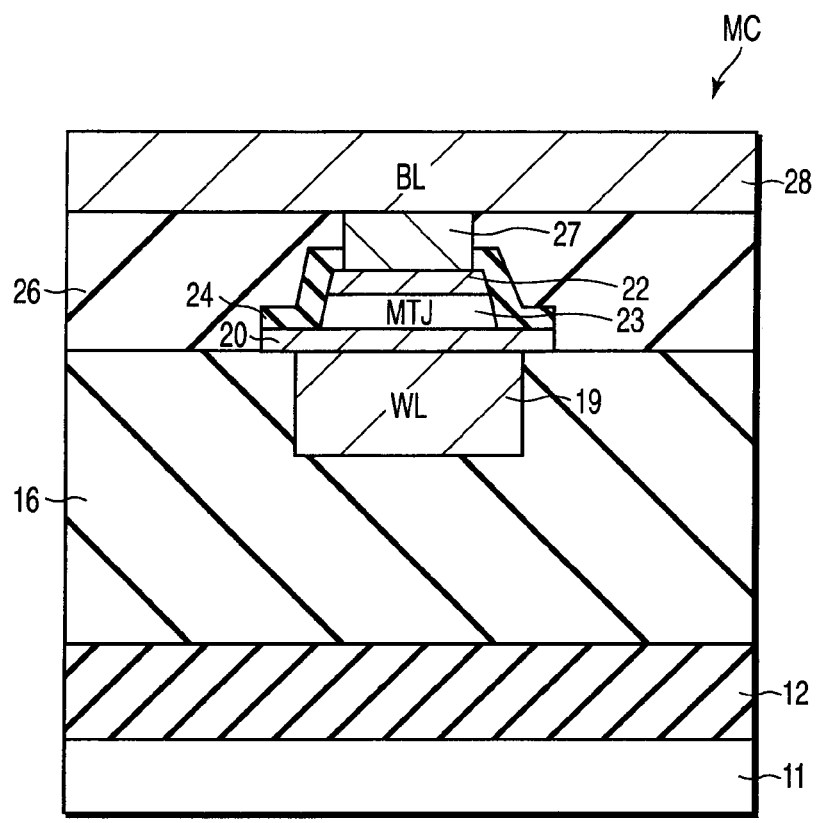

FIGS. 26A and 26B show a cross-point cell of the magnetic random access memory according to the fourth embodiment of the present invention. The cross-point cell structure will be described below.

As shown in FIGS. 26A and 26B, one cross-point cell MC includes one MTJ element 23, the bit line BL, and a word line WL.

More specifically, the MTJ element 23 is arranged near the intersection between the bit line BL and the word line WL. One terminal of the MTJ element 23 is connected to the word line WL through a lower electrode 20. The other terminal of the MTJ element 23 is connected to the bit line BL through an upper electrode 22 and a contact 27.

In the cross-point memory cell, the data write operation is the same as that of the select transistor memory cell. The write currents Iw1 and Iw2 are supplied to the bit line BL and word line WL to made the magnetization of the MTJ element 23 parallel or anti-parallel. In the data read operation, currents are supplied to the bit line BL and word line WL connected to the selected MTJ element 23 to read out the data of the MTJ element 23.

(d) Toggle Memory Cell

Figure 27:
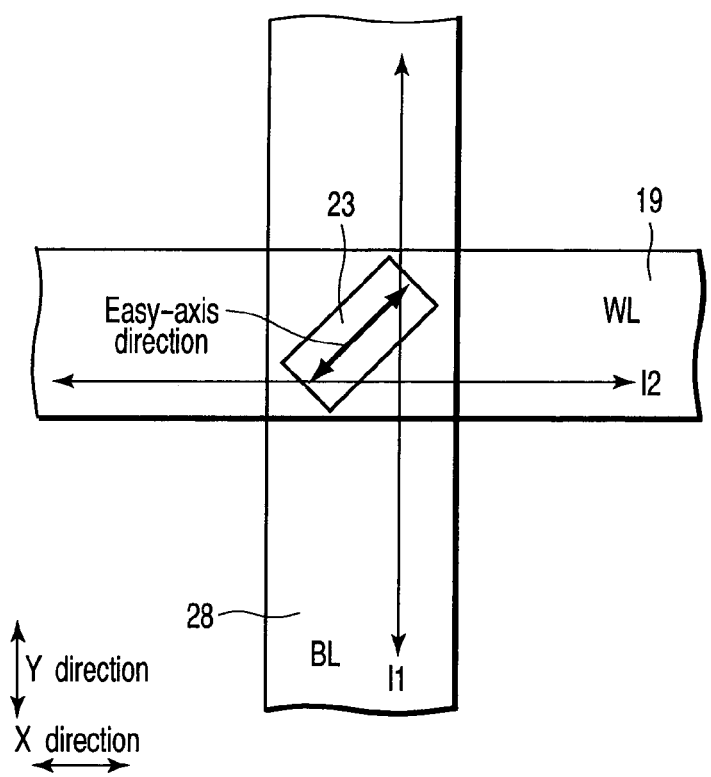
FIG. 27 is a plan view showing a toggle cell of the magnetic random access memory according to the fourth embodiment of the present invention.

FIG. 27 shows a toggle cell of the magnetic random access memory according to the fourth embodiment of the present invention. The toggle cell structure will be described below.

As shown in FIG. 27, in the toggle cell, the easy-axis of the MTJ element 23 is tilted with respect to the running direction (Y direction) of the bit line BL or the running direction (X direction) of the word line WL. The tilt of the MTJ element 23 is, e.g., 30° to 60°, and preferably, 45°.

In the toggle cell, data is written/read in the following way.

The write operation is executed in the following way. In the toggle write, before arbitrary data is written in the selected cell, the data of the selected cell is read out. If it is determined by reading out the data of the selected cell that the arbitrary data has already been written, no write is executed. If data different from the arbitrary data is written, the write is executed to rewrite the data.

After the above-described check cycle, if data must be written in the selected cell, the two write wiring lines (bit line BL and word line WL) are sequentially turned on. The write wiring line turned on first is turned off. Then, the write wiring line turned on next is turned off. For example, the procedures comprise four cycles: the word line WL is turned on to supply the write current Iw2→the bit line BL is turned on to supply the write current Iw1→the word line WL is turned off to stop supplying the write current Iw2→the bit line BL is turned off to stop supplying the write current Iw1.

In the data read operation, currents are supplied to the bit line BL and word line WL connected to the selected MTJ element 23 to read out the data of the MTJ element 23.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a magnetic random access memory, comprising:
   forming a material layer to be processed into a magnetoresistive element;
   processing at least part of the material layer in a process apparatus to form the magnetoresistive element; and
   forming a first protective film which covers side surfaces of the magnetoresistive element,
   wherein the processing of the at least part of the material layer and the forming of the first protective film are performed in a consistently vacuum state in the process apparatus.

2. The method according to claim 1, wherein the first protective film is formed by one of sputtering, plasma CVD, and ALD.

3. The method according to claim 1, further comprising
   before formation of the material layer, forming a lower electrode below the magnetoresistive element, and
   after formation of the first protective film, processing the first protective film and the lower electrode at once.

4. The method according to claim 1, further comprising forming, on the first protective film, a second protective film essentially formed of a material different from a material of the first protective film.

5. The method according to claim 4, wherein the second protective film is formed by one of sputtering, plasma CVD, and ALD.

6. The method according to claim 4, wherein the second protective film is formed in the consistently vacuum state in the process apparatus.

7. The method according to claim 4, wherein the second protective film is formed only on the first protective film at an upper portion of the side surfaces of the magnetoresistive element.

* * * * *